(12) United States Patent
Banoo et al.

(10) Patent No.: US 7,480,874 B2
(45) Date of Patent: Jan. 20, 2009

(54) RELIABILITY ANALYSIS OF INTEGRATED CIRCUITS

(75) Inventors: Kausar Banoo, Bethlehem, PA (US);
Seung H. Kang, Sinking Spring, PA (US); Shahriar Moinian, New Providence, NJ (US); Blane A. Musser, Topton, PA (US); John A. Pantone, Birdsboro, PA (US)

(73) Assignee: Agere Systems Inc., Allentown, PA (US)

( * ) Notice: Subject to any disclaimer, the term of this patent is extended or adjusted under 35 U.S.C. 154(b) by 427 days.

(21) Appl. No.: 11/198,930

(22) Filed: Aug. 5, 2005

(65) Prior Publication Data
US 2007/0033555 A1 Feb. 8, 2007

(51) Int. Cl.
*G06F 17/50* (2006.01)
(52) U.S. Cl. .................... 716/1; 716/4; 716/5
(58) Field of Classification Search ............... 716/1–2, 716/4–5, 8; 703/13–14, 17–18
See application file for complete search history.

(56) References Cited

U.S. PATENT DOCUMENTS

| | | | | |
|---|---|---|---|---|
| 6,311,147 B1* | 10/2001 | Tuan et al. | ........... | 703/18 |
| 6,438,729 B1* | 8/2002 | Ho | ........... | 716/1 |
| 6,675,139 B1* | 1/2004 | Jetton et al. | ........... | 703/17 |
| 7,131,096 B1* | 10/2006 | Balsdon et al. | ........... | 716/13 |
| 2002/0174409 A1* | 11/2002 | Cohn et al. | ........... | 716/6 |
| 2003/0014201 A1* | 1/2003 | Schultz | ........... | 702/64 |
| 2004/0044974 A1* | 3/2004 | Sharma et al. | ........... | 716/5 |
| 2004/0168136 A1* | 8/2004 | Mau et al. | ........... | 716/4 |

OTHER PUBLICATIONS

User Guide Introduction to SPICE, University of California, Berkeley, http://bwrc.eecs.berkeley.edu/Classes/IcBook/SPICE/UserGuide/overview.html, downloaded on Apr. 14, 2006.
"Electromigration for Designers: An Introduction for the Non-Specialist," Cadence Design Systems, Inc. (2002).
"Netlist," Wikipedia, http://en.wikipedia.org/wiki/Netlist, last modified on Jun. 24, 2005; downloaded on Jul. 11, 2005.

* cited by examiner

*Primary Examiner*—Paul Dinh
(74) *Attorney, Agent, or Firm*—Ryan, Mason & Lewis, LLP

(57) ABSTRACT

Techniques are presented for reliability analysis of integrated circuits. A circuit data file including a connectivity network with appended parasitic information is obtained. Circuit performance is simulated, based on the data file, to obtain simulated currents for metallic conductive paths of the circuit. Contextual representations of the paths are determined, and reliability analysis is performed on the contextual representations. The analysis can relate, for example, to electromigration, joule-heating, and/or fusing. The results of the analysis can be provided, for example, in the form of a report including recommended changes, such as width increases, to wires for which it is determined that reliability issues exist.

21 Claims, 4 Drawing Sheets

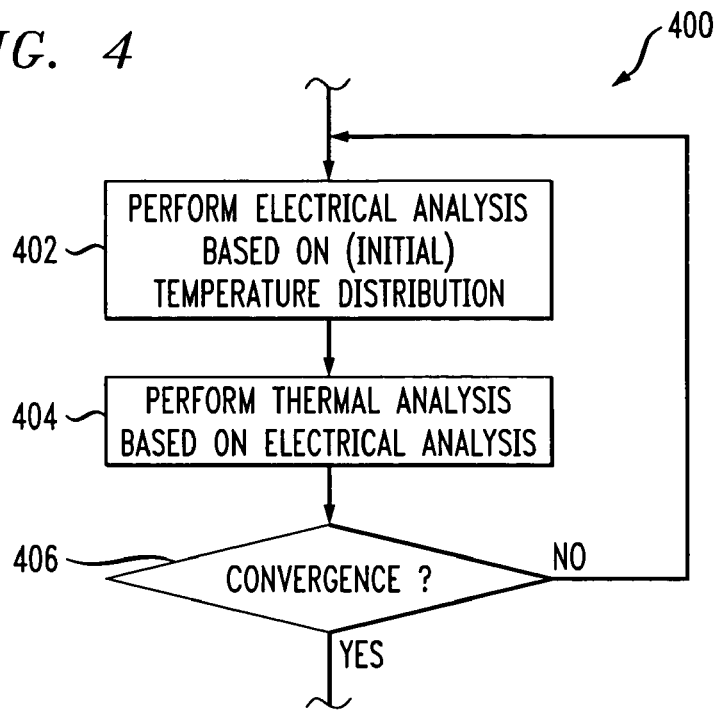
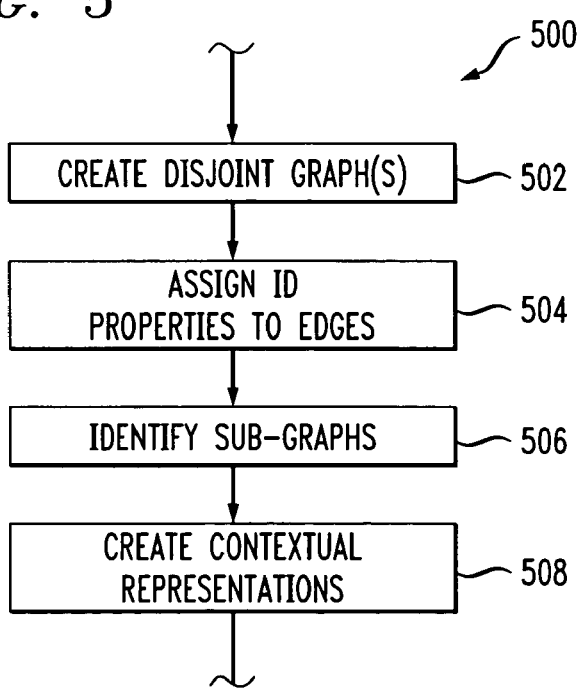

RELIABILITY ANALYSIS OF INTEGRATED CIRCUITS

FIELD OF THE INVENTION

This invention relates to the design of integrated circuits and, more specifically, to methods and apparatus for the reliability analysis of integrated circuit designs.

BACKGROUND OF THE INVENTION

As integrated circuit (IC) technology shrinks and current densities increase, the current-carrying capacity of metallic conductive paths, such as metal wires and vias, is stretched to its limits. High current densities can cause metal wires and vias to develop defects, such as voids or shorts, over long periods of operation due, for example, to electromigration, joule-heating, or fusing. Products incorporating integrated circuits that develop such defects may fail in use.

Prior techniques to deal with such difficulties have included use of manual methods (for example, with respect to power ICs) to estimate high current density regions, with concomitant addition of conductive material to such regions. Manual methods are not feasible for use with large and complex ICs, such as high-density mixed-signal ICs which carry large currents and are expected to work reliably at high operating temperatures over many years. Automated methods might employ reliability analyses performed on discretized elements rather than actual geometric representations of pertinent metallic conductive paths. Prior techniques, manual and automated, may be overly pessimistic and result in an overly conservative design. Numerous false indications of failure, requiring manual correction, may negate any benefit from automated techniques.

Because of these disadvantages, methods and apparatus that allow, e.g., automated detection and/or accurate reliability analysis of potential trouble spots, such as high current density areas, would be advantageous.

SUMMARY OF THE INVENTION

The present invention provides techniques for designing an integrated circuit wherein potential high current density regions can be systematically located, allowing for the implementation of appropriate design modifications to address reliability concerns.

An exemplary embodiment of a method for designing an integrated circuit, according to one aspect of the invention, includes the steps (which can be performed by a data processing unit including a processor and a memory) of: obtaining a circuit data file, simulating circuit performance, determining contextual representations of metallic conductive paths, and performing reliability analysis on the contextual representations of the metallic conductive paths to determine whether a design for the integrated circuit meets reliability criteria. In the obtaining step, the circuit data file can be in the form of a connectivity network, such as, for example, a netlist, with appended parasitic information. In the simulating step, the simulation can be based on the connectivity network.

The results of the simulating step can include simulated currents for discretized representations of the metallic conductive paths. The contextual representations of the metallic conductive paths can be based on the discretized representations. The reliability analysis can include a comparison of limits, such as current limits, with simulated parameters, such as currents or current densities, for the contextual representations of the metallic conductive paths.

Accordingly, one or more embodiments of the present invention can provide one or more of automated reliability analysis, contextual analysis of conductive paths such as wires and vias, and enhanced predictive accuracy as compared to other techniques.

BRIEF DESCRIPTION OF THE DRAWINGS

FIG. 4 depicts of a flow chart of a possible exemplary technique for performing combined thermal and electrical analysis in accordance with an aspect of the invention;

FIG. 5 depicts of a flow chart of a possible exemplary technique for determining contextual representations of wires and/or vias in accordance with an aspect of the invention;

DETAILED DESCRIPTION OF THE INVENTION

Figure 1:
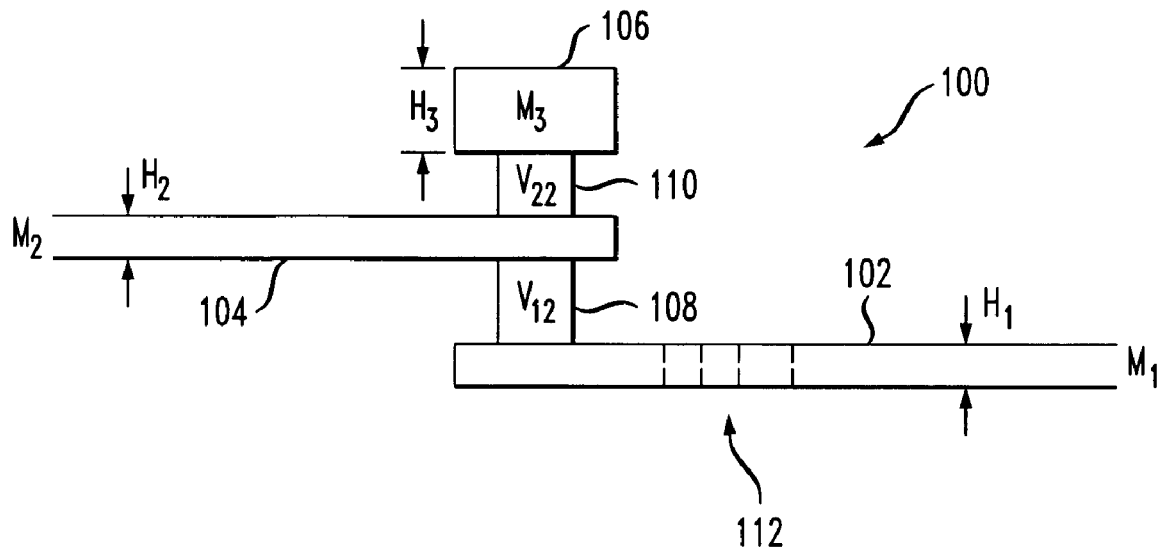
FIG. 1 shows an elevational view of layers of an IC with wires and vias.

FIG. 1 shows an elevational view of an integrated circuit 100 having three layers with metallic portions M1, M2 and M3 (e.g., wires) numbered, respectively, 102, 104 and 106. The layers are separated by other layers, for example, non-conductive layers, which are omitted for clarity, and which might contain, e.g., one or more devices (such as transistors) or portions thereof. The layers, although separated by non-conductive dielectrics, are electrically interconnected by vias V12 and V22 numbered, respectively, 108 and 110. Each layer has a height, designated respectively as H1, H2 and H3, which may typically be more-or-less fixed by process considerations. Current density vectors would typically be pointing into or out of the page for M3, to the left or right for M1 and M2, and up or down for the vias V12 and V22. Modeling techniques typically discretize metallic conductive paths such as wires and vias. As shown at region 112, a number of discrete elements, depending on the type of analysis, can be employed (the remainder of the conductive paths can also be broken up into such elements, but this is omitted for purposes of illustrative convenience).

Figure 2:
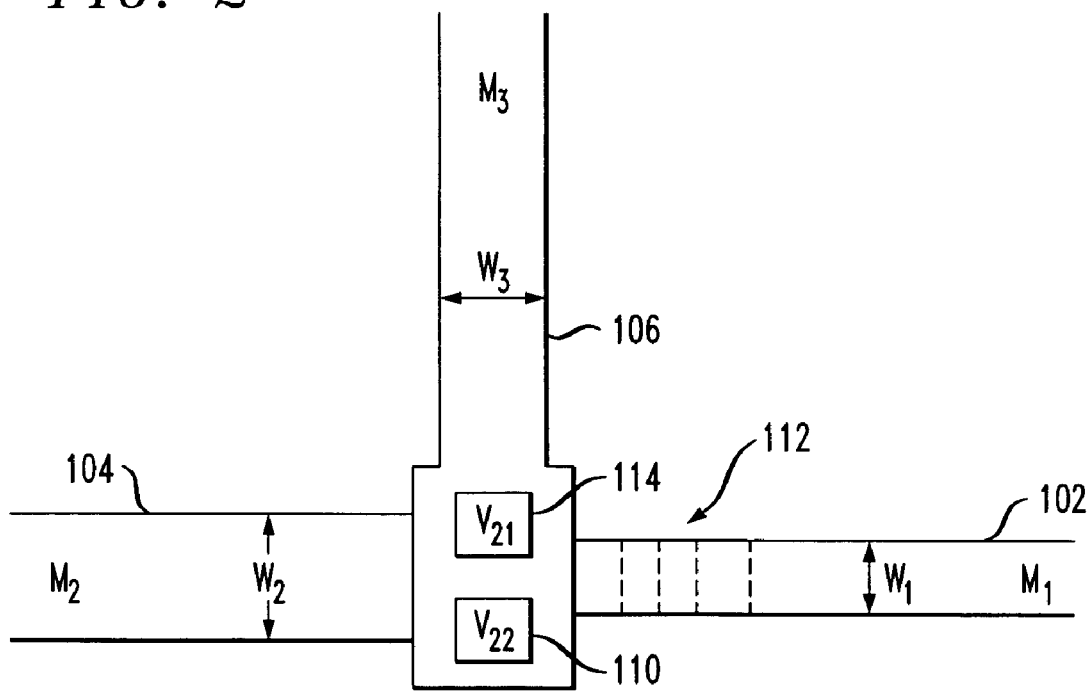
FIG. 2 shows a top plan view of the IC of FIG. 1.

FIG. 2 shows a top view of the circuit of FIG. 1 (for purposes of illustrative clarity and convenience, hidden lines are not used). It can be seen that the wires M1, M2 and M3 each have a width W1, W2 and W3. The cross sectional area of each wire is thus the product of its width and its height; with the height essentially fixed by process considerations, changes to the area are made by changing the width. Wires 104 and 106 are connected by an additional via V21, numbered 114, not visible in FIG. 1. A similar second via V11 could be provided between wires 102, 104.

As will be discussed below, the present invention can provide contextual modeling capability for conductive paths such as wires and vias. Techniques not employing the present invention have tended to focus on reliability analysis of individual discretized elements 112, rather than wires, vias, or other conductive paths as a whole.

Figure 3:
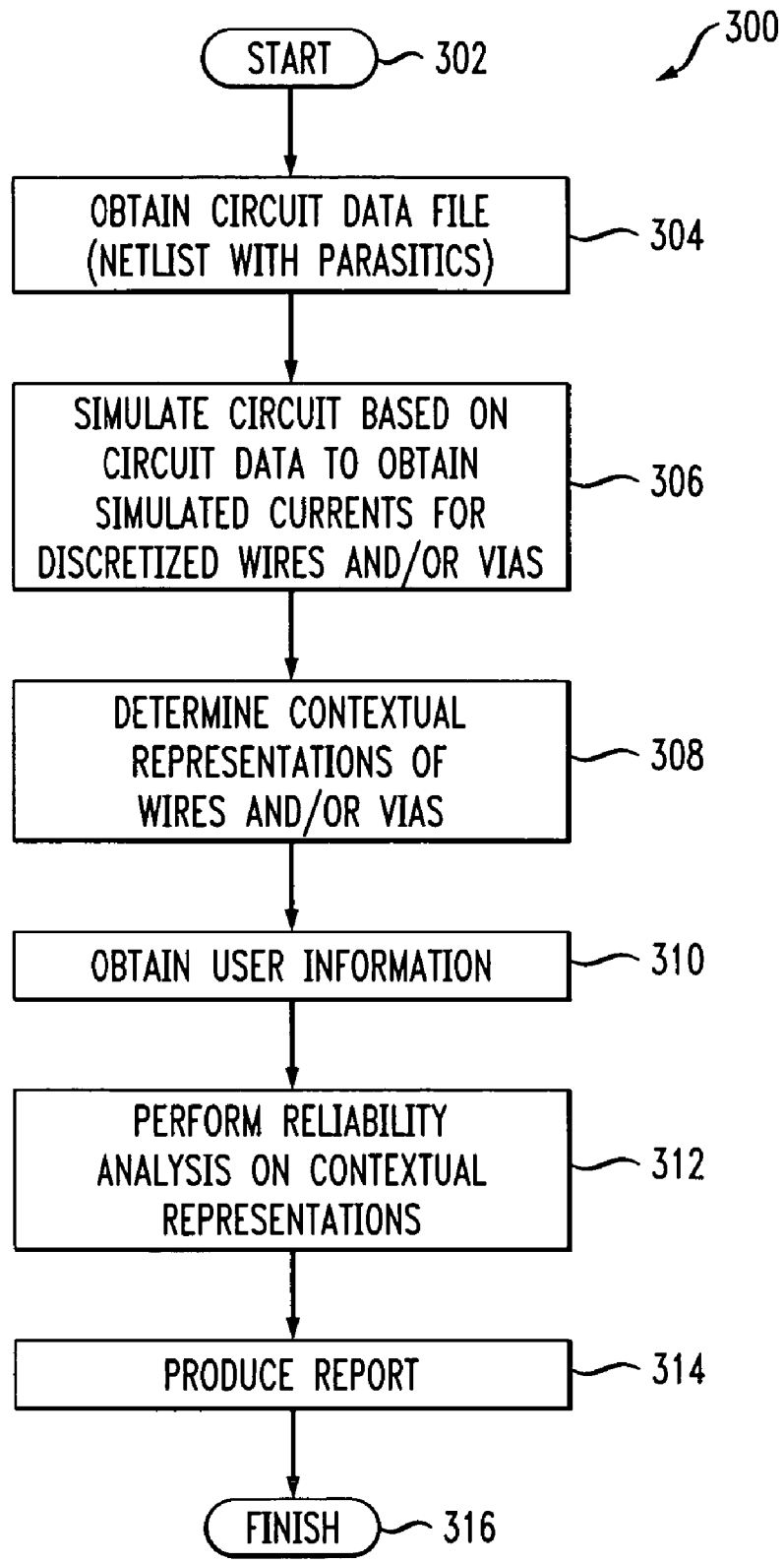
FIG. 3 depicts a flow chart of an exemplary embodiment of a method, according to one aspect of the invention, for designing an IC.

Turning now to FIG. 3, flow chart 300 shows exemplary method steps for designing an integrated circuit, according to an aspect of the present invention. The method can be performed, for example, by a data processing unit including a processor and a memory. After starting at 302, the method can include the step 304 of obtaining a circuit data file in the form of a connectivity network with appended parasitic information. The connectivity network can be, for example, of the kind known in the computer-aided circuit design field, as a "netlist." Parasitic information can include, for example, capacitances and resistances of portions of the circuit other than those deliberately designed into the circuit as circuit elements, such as parasitic resistances and parasitic capacitances of the metallic conductive paths. One possible manner of obtaining the circuit data file will be discussed with regard to FIG. 6 below.

The method can further include the step 306 of simulating circuit performance, based on the connectivity network with the appended parasitic information, to obtain results. Such results can include simulated currents for discretized representations of metallic conductive paths, such as wires and/or vias. The simulation can be performed, for example, with the well-known SPICE program. As indicated at block 308, contextual representations of the metallic conductive paths can be determined based on the discretized representations. As will be discussed below with regard to FIG. 5, the contextual representations refer to representations of the metallic conductive paths, such as wires and/or vias, as substantially integral entities with substantially accurate dimensions and geometries, upon which reliability analyses can be conducted (as opposed to conducting such analyses on discrete elements 112 as might be done in some other techniques). "Substantially integral entities," as used herein, means that the wires or vias are analyzed as complete shapes (including where desired as part of a larger assembly such as an array of vias) or at least as shapes that are sufficiently more complete than the discretized elements (employed by the extracted layout used for circuit simulations) such that reasonably accurate reliability predictions can be made. Furthermore, "substantially accurate dimensions and geometries," as used herein, means dimensions and geometries that are themselves sufficiently accurate such that the aforementioned reasonably accurate reliability predictions can be made.

As indicated at step 310, appropriate user information can optionally be obtained. Such information can include, for example, current limits as a function of metallic conductive path geometry and required lifetime. Alternatively, a library with values for some or all of this type of information could be provided as part of a computer program embodying one or more aspects of the present invention. The current limits may also be a function of, e.g., temperature, and may be, for example, in terms of average, RMS, or peak currents (or in terms of current densities). The conductive path geometry can include, for example, the number of metallic conductive paths in a given context (for example, the number of vias between two layers) and the contextual shape of the paths, for example, length, width, and/or height. Since the reliability equations model paths as a whole, the contextual approach described herein is believed capable of greater accuracy than techniques that apply the reliability equations to the discrete elements.

The user information can also include product lifetime, yield, and duty cycle. Product lifetime is simply the length of time, for example the number of years, that it is desired to have the IC function for. Yield refers to the percentage of ICs that it is desired should survive for the full lifetime (since models are statistical in nature, survival is not normally stated as a matter of certainty). Duty cycle refers to the percentage of time that the IC is operating, and could include a more sophisticated profile describing conditions at different levels rather than a simple ON or OFF model. User information could further include what may be referred to as a "statistical probability of occurrence": since modeling is typically done based on a so-called "corner case," i.e., assuming that all devices pump out the highest current, one can correct for this fact by derating the currents to account for the statistical distribution of actual operating currents in devices.

As shown in step 312, the method can include performing reliability analysis on the contextual representations of the metallic conductive paths to determine whether a design for the integrated circuit meets reliability criteria. Such reliability analysis can include, for example, comparing context-dependent reliability limits, such as current limits for various failure modes, against simulated or calculated values. The limits can be based on the geometry of the contextual representations. Calculations can include, for example, the predicted lifetime for each shape (such as a wire, via, or via array), the percent over the current limit for each shape, and the like. The reliability analysis could be with respect to, for example, electromigration, joule-heating, and/or fusing analysis.

Reliability criteria are typically geometry-dependent, such that more accurate results can be expected from applying reliability criteria to contextual representations of metallic conductive paths, such as wires and/or vias, than from application of such criteria to discrete elements 112. For example, electromigration models are typically length-dependent for conductive paths (such as wires, e.g.) and size dependent for vias. Thus, applying them to a complete via or via array with known size, or to a complete wire with known length, width and height, should produce more accurate results than application to unrealistic discrete elements.

A further optional method step 314 can include producing a report with results of the reliability analysis. The report could include, e.g., recommended changes, such as width increases, to those of the wires for which it is determined that reliability issues exist. Since the height of the various layers is typically fixed by manufacturing process issues, width increases are the typical manner in which cross-sectional area is increased for wires (wires in ICs are typically rectangular). In the case of vias, the report could recommend additional vias for a given path. The results can be listed, for example, for each shape, in descending order of percent over the pertinent current limit, or ascending order of lifetime. Of course, results for other shapes, and other kinds of recommended changes, could be calculated and presented.

The finish of a pass through the exemplary method is indicated at block 316.

FIG. 4 depicts a flow chart 400 of exemplary method steps for performing a coupled electrical-thermal simulation that can be used, for example, with respect to step 306 of FIG. 3. It should be noted that electrical and reliability calculations are typically temperature-dependent. In one approach, the aforementioned simulating step 306 can be performed based on a predetermined temperature distribution. Such distribution can be, for example, calculated from thermal analysis techniques, estimated, or assumed. Several different simulations could be run for different temperature levels. In FIG. 4, a somewhat more sophisticated approach, namely, a coupled electrical-thermal simulation, is shown. The example of FIG. 4 shows an iterative technique, but simultaneous solutions can also be employed. In step 402, electrical analysis is performed based on an initial temperature distribution, which can be, for example, assumed. In step 404, a thermal analysis is performed based on results (such as power dissipation) of the electrical analysis, to obtain a thermal analysis result. Note that the thermal analysis depends on the electrical analysis (for example, on the power dissipations) and the electrical analysis depends on the thermal analysis (for example, temperature dependency of devices). As shown in decision block 406, the steps are iteratively repeated until convergence is achieved, for example, until subsequent calculations yield little or no change in simulated results.

Suitable analytical techniques include electro-thermal circuit simulation with an electronic modeling tool such as the aforementioned SPICE program, using a thermal model attached to the circuit simulation. Parameters such as power, temperature, and voltage can be determined in this manner. One or more of finite element analysis or finite difference analysis techniques could also be employed in appropriate circumstances.

FIG. 5 shows a flow chart 500 of exemplary method steps, according to an aspect of the invention, for determining the contextual representations of the metallic conductive paths, such as wires and/or vias. Step 502 includes creating one or more disjoint graphs from the connectivity network of the circuit including only the discretized wires and vias (excluding devices). The edges of the graph(s) correspond to the wires and vias while the nodes correspond to the connectivity between them. In step 504, the edges are assigned identification (properties) according to their metal/via layer, geometry (width, length, height, number) and current. In step 506, using an edge-based graph search, sub-graphs are identified as sets of nodes and edges that show distinct connectivity patterns and properties with respect to each other. These sub-graphs can be physically manifested as continuous lines, via arrays, metal stacks, multi-finger branches, and the like. This search is made efficiently by initiating the sub-graph searching only on edges with currents higher than a threshold based on reliability limits. In step 508, based on these collected sub-graphs, contextual representations of the metallic conductive paths are created.

It will thus be appreciated that, instead of applying reliability criteria to elements 112, they can be applied to an entire metallic conductive path, such as a wire or via, and such paths can be considered in the context of their connectivity. One exemplary benefit of this aspect of the invention arises because of the length dependence of electromigration rules (shorter wires tend to be less susceptible). In techniques employing elements 112 without an awareness of their dimensions and/or which conductive path they form a part of, one might, out of conservatism, unnecessarily use the rules for long wires and thus obtain overly pessimistic results. Accordingly, one or more aspects of the present invention are potentially advantageous in addressing failure modes where the models are geometry-dependent, such as length- or size-dependent electromigration failure criteria.

Figure 6:
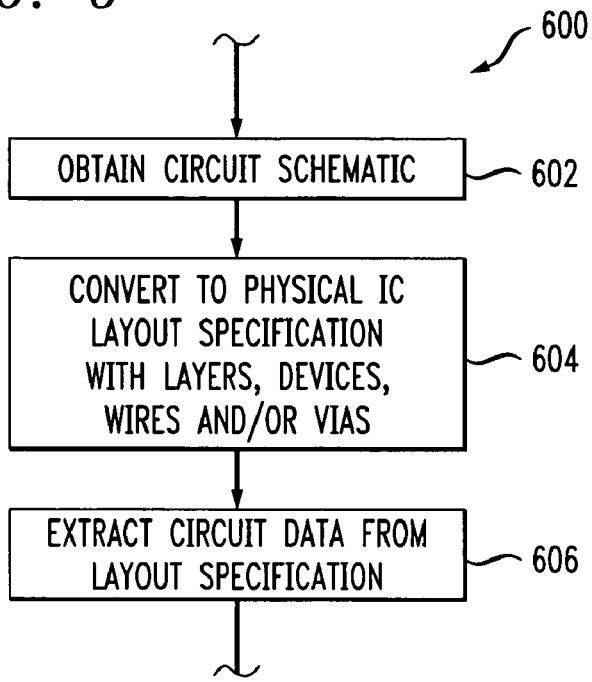
FIG. 6 depicts of a flow chart of a possible exemplary technique for obtaining a circuit data file in accordance with an aspect of the invention.

With reference now to FIG. 6, a flow chart 600 shows exemplary method steps for one possible manner of obtaining the circuit data file in step 304 of FIG. 3, according to one aspect of the invention. As shown at step 602, a circuit schematic can be obtained. In step 604, the schematic can be converted to a physical design specification (i.e., an IC layout) using, e.g., a computer-aided-design (CAD) tool. The physical design specification can include a number of layers containing a number of devices connected by the metallic conductive paths, such as wires and/or vias, and can be, e.g., in the form of a series of images in the CAD tool. In step 606, the circuit data file in the form of the connectivity network (such as a netlist) with the appended parasitic information can be extracted from the physical design specification. In addition to the parasitic information, supplemental device information can also be included. The parasitic information and supplemental device information would typically not be available from a mere schematic, but once the layout is constructed, physical dimensions of devices and interconnections such as the conductive paths are available, and thus the schematic can be augmented with such information to obtain the connectivity network with appended information.

Figure 7:
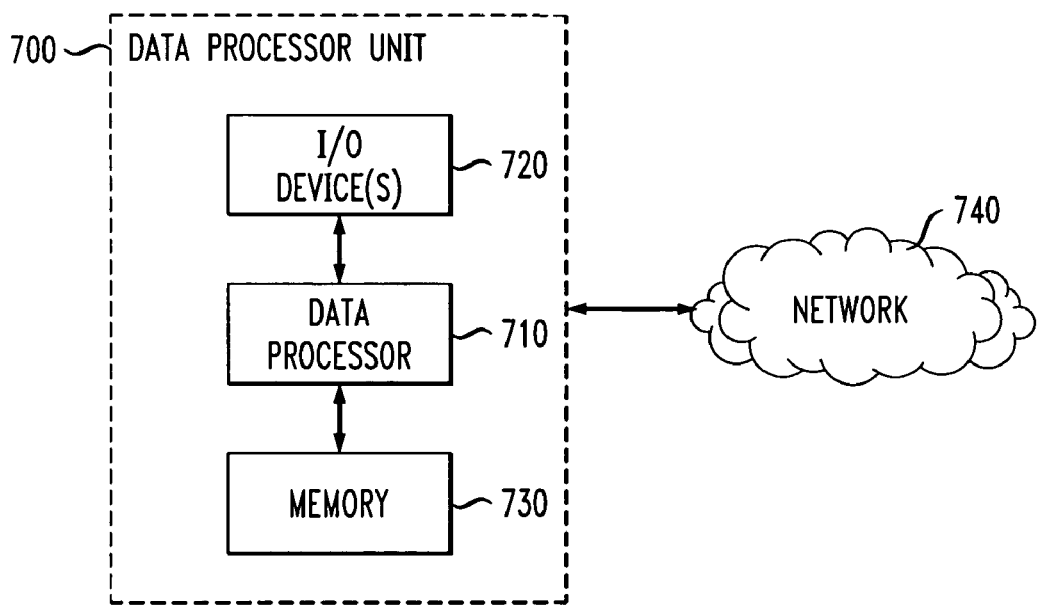
FIG. 7 shows an exemplary data processing system which can implement one or more steps and/or elements of one or more exemplary embodiments of the present invention.

FIG. 7 is a block diagram of a data processing system 700 that can implement the processes of the present invention. The data processing unit 700 contains three portions: a data processor portion 710, an input/output (I/O) device portion 720, and a memory portion 730. The memory portion 730 can configure the processor 710 to implement the aforementioned processes, such as one or more of the methods, steps, and functions disclosed herein. The memory 730 could be distributed or local and the processor 710 could be distributed or singular. The memory 730 could be implemented as an electrical, magnetic or optical memory, or any combination of these or other types of storage devices. It should be noted that each distributed processor that makes up processor 710 generally contains its own addressable memory space. Data processing units with the illustrated configuration are commonly used by IC designers and are commercially available. An appropriate data processing unit 700, for instance, would comprise a computer workstation capable of running CAD programs, such as a workstation produced by Sun Microsystems, Inc. (Santa Clara, Calif.). Other types of computers may also be used. The designer may interact with the workstation or other computer through one or more display monitors, keyboards and computer pointing devices. The interaction preferably occurs via a graphical user interface. As further shown in FIG. 7, the exemplary data processing unit or computer system 700 is connected to a network 740. This network connection allows the data processing unit 700 to access files and data external to itself. Of course, the particular configuration is presented by way of example only, and numerous alternative data processing units can be used in implementing the invention. It should also be noted that some or all of computer system 700 can be incorporated into an application-specific or general-use integrated circuit.

System and Article of Manufacture Details

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, or memory cards) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

In another aspect, one or more embodiments of the present invention encompass a product or products designed using the methods, techniques, and apparatuses disclosed herein. Such a product could include, for example, an integrated circuit. In forming integrated circuits, a plurality of identical die are typically fabricated in a repeated pattern on a surface on a semiconductor wafer. Each die can include an entire circuit or elements designed as described herein, and can include other structures or circuits. The individual die are cut or diced from the wafer and then packaged as an integrated circuit. One skilled in the art will know how to dice wafers and package die to produce integrated circuits. Integrated circuits so manufactured are considered part of this invention.

Although illustrative embodiments of the present invention have been described herein, it is to be understood that the invention is not limited to those precise embodiments, and that various other changes and modifications may be made by one skilled in the art without departing from the scope of the invention as set forth in the appended claims.

What is claimed is:

1. A method for designing an integrated circuit comprising the steps, performed by a data processing unit including a processor and a memory, of:
   obtaining a circuit data file in the form of a connectivity network with appended parasitic information;
   simulating circuit performance, based on said connectivity network with said appended parasitic information, to obtain results including simulated currents for discretized representations of metallic conductive paths;
   determining contextual representations of said metallic conductive paths based on said discretized representations; and
   performing reliability analysis on said contextual representations of said metallic conductive paths to determine whether a design for the integrated circuit meets reliability criteria;
   wherein:
   said contextual representations comprise representations of said metallic conductive paths as substantially integral entities with substantially accurate dimensions and geometries, upon which said reliability analysis can be conducted;
   said discretized representations comprise representations of said metallic conductive paths as discrete elements; and
   said appended parasitic information comprises at least one of parasitic resistances and parasitic capacitances of said metallic conductive paths.

2. The method of claim 1, wherein said reliability analysis comprises length-based electromigration analysis.

3. The method of claim 1, wherein said reliability analysis comprises size-based electromigration analysis of vias.

4. The method of claim 1, wherein said reliability analysis comprises joule-heating analysis.

5. The method of claim 1, wherein said reliability analysis comprises fusing analysis.

6. The method of claim 1, wherein said determining step comprises:
   creating at least one disjoint graph from said connectivity network;
   assigning identification properties to edges of said graph;
   identifying sub-graphs having distinct connectivity patterns; and
   creating said contextual representations of said metallic conductive paths based on said sub-graphs.

7. The method of claim 1, wherein said metallic conductive paths comprise at least one of wires and vias.

8. The method of claim 1, wherein said obtaining step comprises:
   obtaining a circuit schematic;
   converting said schematic to a physical design specification using a computer-aided-design (CAD) tool, said physical design specification including a plurality of layers containing a plurality of devices connected by said metallic conductive paths; and
   extracting said circuit data file in the form of said connectivity network with said appended parasitic information from said physical design specification.

9. The method of claim 1, wherein said parasitic information comprises parasitic resistance and parasitic capacitance values associated with said metallic conductive paths.

10. The method of claim 1, wherein said circuit data file further comprises supplemental device information.

11. The method of claim 1, wherein said simulating step is performed based on a predetermined temperature distribution.

12. The method of claim 1, further comprising the additional step of producing a report with results of said reliability analysis, said report comprising recommended changes, in the form of width increases, to those of said metallic conductive paths for which it is determined that reliability issues exist.

13. The method of claim 1, further comprising the additional step of obtaining user information comprising current limits as a function of metallic conductive path geometry and required product lifetime of said integrated circuit.

14. The method of claim 13, wherein said current limits are also a function of temperature.

15. The method of claim 13, wherein said geometry comprises number of said metallic conductive paths in a given context and contextual shape of said paths, said shape comprising at least length and width, and wherein said user information further comprises said product lifetime, yield, and duty cycle.

16. The method of claim 1, wherein said step of performing said reliability analysis comprises comparing said simulated currents to reliability current limits based on geometry of said contextual representations.

17. The method of claim 1, wherein said step of simulating circuit performance comprises performing a coupled electrical-thermal simulation.

18. The method of claim 17, wherein said coupled electrical-thermal-simulation comprises the sub-steps of:
   performing electrical analysis based on an initial temperature distribution;
   performing thermal analysis, based on results of said electrical analysis, to obtain thermal analysis result; and
   repeating said sub-steps of performing said electrical analysis and said thermal analysis, in an iterative fashion, with said thermal analysis result substituted for said initial temperature distribution.

19. A product designed in accordance with the method of claim 1.

20. A tangible computer-readable recordable storage medium having stored therein instructions for causing a data processing unit including a processor and a memory to execute the steps of:

obtaining a circuit data file in the form of a connectivity network with appended parasitic information;

simulating circuit performance, based on said connectivity network with said appended parasitic information, to obtain results including simulated currents for discretized representations of metallic conductive paths;

obtaining contextual representations of said metallic conductive paths from said discretized representations; and performing reliability analysis on said contextual representations of said metallic conductive paths;

wherein:

said contextual representations comprise representations of said metallic conductive paths as substantially integral entities with substantially accurate dimensions and geometries, upon which said reliability analysis can be conducted;

said discretized representations comprise representations of said metallic conductive paths as discrete elements; and said appended parasitic information comprises at least one of parasitic resistances and parasitic capacitances of said metallic conductive paths.

21. An apparatus for designing an integrated circuit comprising a data processing unit having a processor and a memory and being operative to:

obtain a circuit data file in the form of a connectivity network with appended parasitic information;

simulate circuit performance, based on said connectivity network with said appended parasitic information, to obtain results including simulated currents for discretized representations of metallic conductive paths;

obtain contextual representations of said metallic conductive paths from said discretized representations; and perform reliability analysis on said contextual representations of said metallic conductive paths;

wherein:

said contextual representations comprise representations of said metallic conductive paths as substantially integral entities with substantially accurate dimensions and geometries, upon which said reliability analysis can be conducted;

said discretized representations comprise representations of said metallic conductive paths as discrete elements; and said appended parasitic information comprises at least one of parasitic resistances and parasitic capacitances of said metallic conductive paths.

* * * * *